(12) United States Patent
Saito (10) Patent No.: US 9,412,426 B2
(45) Date of Patent: Aug. 9, 2016

(54) ELECTRONIC APPARATUS AND METHOD FOR MEMORY CONTROL

(71) Applicant: Seiko Epson Corporation, Tokyo (JP)

(72) Inventor: Takeshi Saito, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 179 days.

(21) Appl. No.: 13/765,907

(22) Filed: Feb. 13, 2013

(65) Prior Publication Data

US 2013/0212329 A1 Aug. 15, 2013

(30) Foreign Application Priority Data

Feb. 13, 2012 (JP) ................. 2012-028410

(51) Int. Cl.
*G11C 7/10* (2006.01)
*G06F 13/16* (2006.01)

(52) U.S. Cl.
CPC .......... *G11C 7/1072* (2013.01); *G06F 13/1684* (2013.01)

(58) Field of Classification Search
CPC ...... G11C 7/1072; G11C 7/1006; G11C 7/12; G11C 8/12
USPC ........................................................ 711/105
See application file for complete search history.

(56) References Cited

U.S. PATENT DOCUMENTS

| | | | | |
|---|---|---|---|---|
| 5,115,273 A * | 5/1992 | Ujiie | .............. | G03G 15/5066 399/1 |
| 5,179,686 A * | 1/1993 | White | .............. | G06F 12/0684 711/115 |
| 5,301,278 A * | 4/1994 | Bowater | .............. | G06F 13/1689 365/230.03 |
| 5,488,708 A * | 1/1996 | Hayashi | .............. | G06F 9/5016 711/115 |
| 6,125,421 A * | 9/2000 | Roy | .............. | G11C 5/066 711/149 |
| 6,138,204 A * | 10/2000 | Amon | .............. | G11C 7/1048 711/104 |
| 6,272,583 B1 * | 8/2001 | Sakugawa | .............. | G06F 13/1673 710/307 |
| 6,628,611 B1 * | 9/2003 | Mochizuki | .............. | H04L 47/10 370/229 |
| 7,783,826 B2 * | 8/2010 | Taeuber | .............. | G06F 13/4239 710/307 |
| 8,305,834 B2 * | 11/2012 | Richter | .............. | G11C 8/12 365/230.03 |

(Continued)

FOREIGN PATENT DOCUMENTS

| | | |
|---|---|---|
| JP | 2009-116641 A | 5/2009 |
| JP | 2009-116962 A | 5/2009 |
| JP | 2011-186898 A | 9/2011 |

OTHER PUBLICATIONS

Vangie Beal, Understading PC Buses, Nov. 4, 2005. Webopedia.*
(Continued)

*Primary Examiner* — Jared Rutz
*Assistant Examiner* — Khoa D Doan
(74) *Attorney, Agent, or Firm* — Nutter McClennen & Fish LLP; John J. Penny, Jr.

(57) ABSTRACT

An electronic apparatus having plural memories of different performances such as bus widths facilitates achievement of its potential as a system. The electronic apparatus has a first memory and a memory controller configured to control the first memory. Upon a second memory being detected, the memory controller compares bus widths of the first memory and the second memory with each other. Upon the bus width of the second memory being broader than the bus width of the first memory, the memory controller makes a setting such that access to the second memory precedes access to the first memory.

11 Claims, 7 Drawing Sheets

(56) References Cited

U.S. PATENT DOCUMENTS

| | | | |
|---|---|---|---|
| 8,392,662 B2* | 3/2013 | Jang | G06F 12/0246 711/134 |
| 8,737,156 B2* | 5/2014 | Hou | G11C 16/08 365/185.05 |
| 2003/0007411 A1* | 1/2003 | Fukui | G06F 13/28 365/230.03 |
| 2005/0027951 A1* | 2/2005 | Piccirillo et al. | 711/154 |
| 2005/0060484 A1* | 3/2005 | Ogino | G11C 29/16 711/103 |
| 2008/0028119 A1* | 1/2008 | Randell | G06F 13/1678 710/307 |
| 2008/0046662 A1* | 2/2008 | Hosokawa et al. | 711/146 |
| 2008/0205220 A1* | 8/2008 | Shimada | G06F 3/0656 369/53.1 |
| 2008/0235467 A1* | 9/2008 | Tagawa | G06F 12/0246 711/154 |
| 2009/0248958 A1* | 10/2009 | Tzeng | 711/103 |
| 2009/0254710 A1* | 10/2009 | Nonogaki | G06F 12/0893 711/133 |
| 2009/0327573 A1* | 12/2009 | Jang | 711/5 |
| 2010/0115183 A1* | 5/2010 | Araki et al. | 711/103 |
| 2010/0122024 A1* | 5/2010 | Noyes | G06F 13/38 711/108 |
| 2010/0142837 A1* | 6/2010 | Fukuhara | H04N 19/63 382/233 |
| 2010/0185811 A1* | 7/2010 | Kwon | G06F 12/0246 711/105 |
| 2010/0199032 A1* | 8/2010 | Cedar | G06F 12/0653 711/103 |
| 2011/0138115 A1* | 6/2011 | Oh et al. | 711/103 |
| 2011/0205828 A1* | 8/2011 | Richter | G11C 8/12 365/230.03 |
| 2011/0225354 A1* | 9/2011 | Saito | G06F 13/1678 711/105 |
| 2012/0317354 A1* | 12/2012 | Yokota et al. | 711/113 |
| 2013/0073817 A1* | 3/2013 | Kang et al. | 711/154 |
| 2013/0166847 A1* | 6/2013 | Kawamura | G06F 12/0873 711/129 |
| 2013/0254431 A1* | 9/2013 | Kuroiwa | G06F 3/00 710/14 |
| 2013/0326108 A1* | 12/2013 | Nishihara | G06F 12/0246 711/2 |
| 2014/0115235 A1* | 4/2014 | Ito | G06F 12/0868 711/103 |
| 2014/0297983 A1* | 10/2014 | Takeda | G06F 3/0647 711/165 |

OTHER PUBLICATIONS

Yahoo Answers, What is onboard memory, 2009.*

* cited by examiner

ELECTRONIC APPARATUS AND METHOD FOR MEMORY CONTROL

BACKGROUND

1. Technical Field

The present invention relates to an electronic apparatus and a method for memory control.

2. Related Art

An electronic apparatus on which an additional DRAM (Dynamic RAM) can be installed in addition to a preinstalled DRAM is known. An electronic apparatus on which an option DRAM formed by a DIMM (Dual Inline Memory Module) can be installed in addition to an onboard standard DRAM is disclosed, e.g., in JP-A-2011-186898.

Further, the standard DRAM and the option DRAM are allocated starting from a base address in order on allocation data (memory map) of physical addresses of the plural DRAMs in an electronic apparatus such as the above.

Incidentally, if a bus width of the option DRAM is broader than that of the standard DRAM (e.g., 16 bits and 32 bits for the standard and option DRAMs, respectively) in the electronic apparatus such as the above, the memory allocated closer to the base address has a broader bandwidth.

A use of DRAM areas (including standard and option DRAM areas) by a CPU, etc., is unbalanced towards the side allocated closer to the base address in general. Then, the standard DRAM of the narrower bus with is more probably used more than the option DRAM of the broader bus width (the used area is unbalanced towards the standard DRAM) in the electronic apparatus such as the above, and the apparatus cannot achieve its full potential as a system.

SUMMARY

An advantage of some aspects of the invention is that an electronic apparatus on which plural memories of different performances such as bus widths are installed can facilitate achievement of its potential as a system.

The application includes a plurality of measures to solve at least part of the above problem, and such measures are exemplarily enumerated as follows.

A first aspect of the invention to solve the above problem is an electronic apparatus having a first memory and a memory controller configured to control the first memory. If a second memory is detected, the memory controller compares bus widths of the first memory and the second memory with each other, and makes a setting such that access to the second memory precedes access to the first memory upon the bus width of the second memory being broader than the bus width of the first memory.

As access to the second memory of the broader bus width precedes access to the first memory of the narrower bus width according to the above configuration, the electronic apparatus can facilitate achievement of its potential as a system.

In the above configuration, the memory controller may make a setting such that access to the second memory precedes access to the first memory by setting and arranging areas of the second memory and the first memory in order starting from a base address side in a memory area on a memory map.

As the area of the second memory of the broader bus width is allotted to the base address side according to the above configuration, the second memory is more preferentially used and the electronic apparatus can facilitate achievement of its potential as a system.

Further, the memory controller may compare sizes of the first memory and the second memory with each other upon the bus width of the second memory being equal to or narrower than the bus width of the first memory, and may make a setting such that access to the second memory precedes access to the first memory upon the size of the second memory is larger than the size of the first memory.

If the bus width of the second memory is equal to or narrower than the bus width of the first memory, access to the second memory of the larger size precedes access to the first memory of the smaller size according to the above configuration, and thus the electronic apparatus can facilitate achievement of its potential as a system.

Further, the memory controller may compare a size per one memory area selected by a selection signal in the first memory with a size per one memory area selected by a selection signal in the second memory, and may make a setting such that access to the second memory precedes access to the first memory upon the size per memory area in the second memory being larger than the size per memory area in the first memory.

If the memories each include a memory area to be selected by a selection signal, access to the second memory of the larger size per the relevant memory area precedes access to the first memory of the smaller size per the relevant memory area according to the above configuration, and thus the electronic apparatus can facilitate achievement of its potential as a system.

Further, if a plurality of memories each corresponding to the second memory is detected, the memory controller may compare bus widths of the respective memories with one another, and may make a setting such that access to one of the memories of a broader bus width precedes access to another one of the memories.

According to the above configuration, the electronic apparatus can facilitate achievement of its potential as a system in case of having a plurality of memories each corresponding to the second memory, as well.

Further, if bus widths of two of the first memory and the second memories are equal to each other, the memory controller may compare sizes of the memories of the equal bus widths, and may make a setting such that access to one of the compared memories of a larger size precedes access to another one of the compared memories.

According to the above configuration, the electronic apparatus can facilitate achievement of its potential as a system in case of having a plurality of memories each corresponding to the second memory and having two of the memories of equal bus widths, as well.

Further, the memory controller may output a selection signal to select the second memory if an address indicating a location in the memory areas specified by an access request indicates the inside of the second memory in the memory areas, and may output a selection signal to select the first memory if the address indicates the inside of the first memory in the memory areas.

As the memory controller selects which memory is accessed on the basis of area allotments of the respective memories having been set according to the above configuration, the electronic apparatus can facilitate achievement of its potential as a system with a simplified configuration.

A second aspect of the invention to solve the above problem is an electronic apparatus having a first memory, a memory controller configured to control the first memory, and a CPU. If a second memory is detected, the CPU compares bus widths of the first memory and the second memory with each other, and makes a setting such that access to the second memory precedes access to the first memory upon the bus width of the second memory being broader than the bus width of the first memory.

As access to the second memory of the broader bus width precedes access to the first memory of the narrower bus width according to the above configuration, the electronic apparatus can facilitate achievement of its potential as a system.

If the second memory is detected in the above configuration, the memory controller may set and arrange areas of the first memory and the second memory in order starting from a base address side in a memory area on a memory map, and may set an address corresponding to a sum of the base address and a size of the first memory as a base address for access that the CPU uses so as to access the memory area, and may make a setting such that the area of the first memory follows an address corresponding to a sum of the base address for access and a size of the second memory, so that access to the second memory precedes access to the first memory.

As the area of the second memory of the broader bus width is allotted to the base address side according to the above configuration, the second memory is more preferentially used and the electronic apparatus can facilitate achievement of its potential as a system. Further, hardware design of the memory controller, etc., is never or barely changed owing to the achievement of such a measure by the CPU.

A third aspect of the invention to solve the above problem is a method for memory control of an electronic apparatus having a first memory and a memory controller configured to control the first memory. If a second memory is detected, the memory controller compares bus widths of the first memory and the second memory with each other, and makes a setting such that access to the second memory precedes access to the first memory upon the bus width of the second memory being broader than the bus width of the first memory.

A fourth aspect of the invention to solve the above problem is a method for memory control of an electronic apparatus having a first memory, a memory controller configured to control the first memory and a CPU. If a second memory is detected, the CPU compares bus widths of the first memory and the second memory with each other, and makes a setting such that access to the second memory precedes access to the first memory upon the bus width of the second memory being broader than the bus width of the first memory.

Problems, configurations and effects excepting what is described above will be made clear by explanations of embodiments shown below.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

A first embodiment of the invention will be explained below with reference to the drawings.

Figure 1:
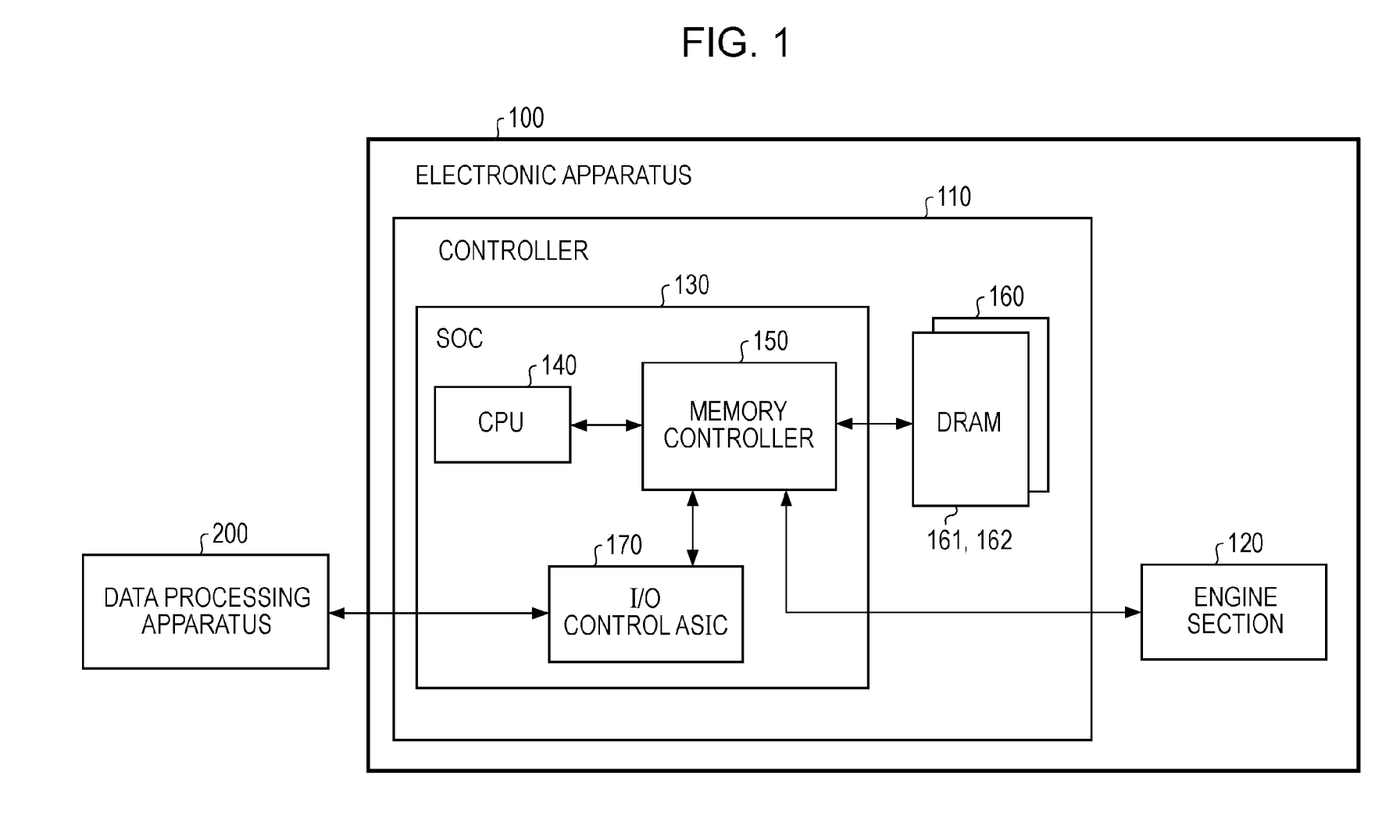
FIG. 1 schematically shows a configuration of an electronic apparatus of a first embodiment of the invention.

FIG. 1 schematically shows a configuration of an electronic apparatus of the first embodiment of the invention. As shown there, an electronic apparatus 100 is coupled with a data processing apparatus 200.

The data processing apparatus 200 works as a host computer for the electronic apparatus 100. The data processing apparatus 200 is a computer having, e.g., a CPU, a RAM, a ROM, an auxiliary storage device such as a hard disk, a display monitor, an input device such as a keyboard or a mouse, and a communication interface which are not shown. The data processing apparatus 200 runs, e.g., an application program and a driver program for controlling the electronic apparatus 100 (e.g., a printer driver program).

The electronic apparatus 100 is a multifunction printer having, e.g., printing and copy functions, etc. The electronic apparatus 100 has a controller 110 which works as an electronic apparatus control device to control various kinds of functions in the electronic apparatus 100, and an engine section 120 which carries out printing on a printing medium or reading a document. The electronic apparatus is not limited to a multifunction printer as a matter of course, and may be an apparatus such as a printer, a scanner, a facsimile machine, a copy machine, etc.

The controller 110 has a CPU 140, a memory controller 150, a DRAM 160 and an I/O (Input/Output) control ASIC (Application Specific Integrated Circuits) 170. The controller 110 controls various kinds of functions of the engine section 120, etc., and achieves printing, facsimile, scanner and copy functions, etc., including various kinds of image processing. The controller 110 is not limited to the above configuration as a matter of course, and the CPU 140, e.g., may be incorporated in the memory controller 150.

Further, the CPU 140, the memory controller 150 and the I/O control ASIC 170 are mounted in an integrated circuit called an SOC (System On a Chip) 130 hereafter.

The CPU 140 accesses the DRAM 160 via the memory controller 150 and carries out various kinds of data processing by reading and writing various kinds of programs and data. The CPU 140 provides the memory controller 150 with an access request for access to the DRAM 160.

The memory controller 150 controls access from the CPU 140, the I/O control ASIC 170 and the engine section 120 to the DRAM 160. The memory controller 150 may control direct memory access (DMA) to the DRAM 160 without intervention by the CPU 140 as a matter of course.

The DRAM 160 is a memory, e.g., a DDR-SDRAM to be controlled by the memory controller 150. The DRAM 160 of the embodiment includes a standard DRAM (On Board) 161 directly mounted on a controller board on which the memory controller 150 and so on are mounted and an option DRAM 162 formed by a plurality of DRAM chips such as DIMMs (Dual Inline Memory Modules) mounted on a printed board. The standard DRAM cannot be removed from a board by a user as usual. Meanwhile, the option DRAM 162 can be put onto and removed from a board by a user (i.e., a removable portion).

In order that each of the DRAM 160 is accessed, the DRAM 160 to be accessed is selected according to a chip selection signal. A DRAM in which a plurality of DRAM chips is mounted (corresponding to the option DRAM 162 of the embodiment) is of a type such that chip selection is done (access to a chip is made) either on an entire plural DRAM chips basis or on an individual DRAM chip basis. The option DRAM 162 of the embodiment may have either type of configuration. The standard DRAM 161 may be one in which a plurality of DRAM chips is mounted as a matter of course.

The I/O control ASIC 170 controls data transmission to and from an external device (the data processing apparatus 200, etc.).

The engine section 120 includes a paper feed and ejection mechanism, a printing mechanism, a scanning mechanism, etc., for achieving printing, facsimile, scanner and copy functions and so on, and includes, e.g., a printing engine, a scanner engine, etc.

Figure 2:
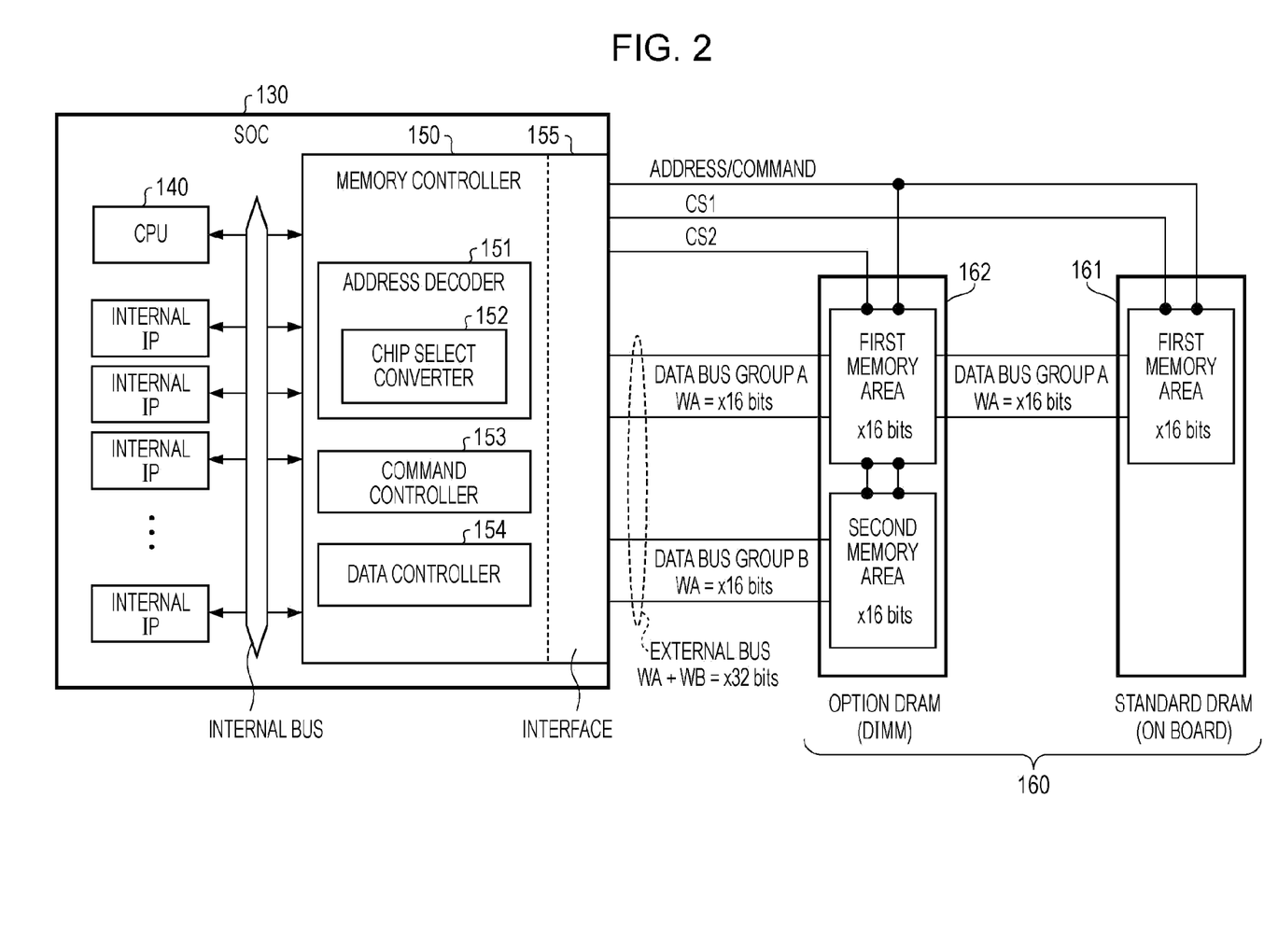
FIG. 2 schematically shows a configuration related to DRAM access by a SOC.

FIG. 2 schematically shows a configuration related to DRAM access by the SOC.

The CPU 140 and other units (which means devices coupled with the I/O control ASIC 170, the engine section 120, etc., and called "internal IP" hereafter) are coupled with the memory controller 150 via an internal bus. Further, the standard DRAM 161 and the option DRAM 162 are coupled with the memory controller 150 via an external bus.

The external bus of the embodiment can be divided into a data bus group A and a data bus group B. The data bus group A couples the memory controller 150, a first memory area (DRAM chip) of the option DRAM 162 and a first memory area (DRAM chip) of the standard DRAM 161 with one another. The data bus group B couples the memory controller 150 with a second memory area (DRAM chip) of the option DRAM 162, and is not coupled with the standard DRAM 161.

The data bus group A has a data bus width (bandwidth) of WA bits (WA is an integer). The data bus group B has a data bus width (bandwidth) of WB bits (WB is an integer). Thus, a data bus width is (WA+WB) bits between the memory controller 150 and the option DRAM 162, which is broader (has a broader bandwidth) than a data bus width between the memory controller 150 and the standard DRAM 161.

Let WA=16, WB=16 and WA+WB=32, e.g., to be specific for the embodiment. Further, suppose that the standard DRAM is 128 MB in size and that the option DRAM is 512 MB (256 MB multiplied by two) in size. Incidentally, the first and second memory areas of the option DRAM 162 can be accessed on a WA bit basis and on a WB bit basis, respectively.

Further, suppose that chip selection of the option DRAM 162 of the embodiment is done on a DRAM (512 MB) basis or on a DRAM chip (256 MB) basis, and that chip selection of the standard DRAM is done on a DRAM (128 MB) basis.

Incidentally, performance (bus width, size, etc.) of an option DRAM of an electronic apparatus is as high as or higher than that of a standard DRAM in lots of cases in general. Thus, such exemplary circumstances are specifically supposed for the embodiment.

The memory controller 150 receives an access request (request for writing, reading, etc.) addressed to the DRAM 160 from the CPU 140 or the internal IP, and carries out data processing to access the DRAM 160. Thus, the memory controller 150 has an address decoder 151, a command controller 153, a data controller 154 and an interface 155. The address decoder 151 has a chip select converter 152.

The address decoder 151 decodes an address. The address decoder 151 converts, e.g., physical address data (a relative address on a memory map) of a target to be accessed accepted together with the access request into address data to be transmitted to the DRAM 160.

Further, the address decoder 151 identifies a DRAM to be accessed (chip select) on the basis of the physical address data of the target to be accessed. If the target to be accessed is the standard DRAM 161, the address decoder 151 provides the standard DRAM 161 with a signal to select the standard DRAM 161 (chip selection signal CS1). If the target to be accessed is the option DRAM 162, the address decoder 151 provides the option DRAM 162 with a signal to select the option DRAM 162 (chip selection signal CS2). Then, the address decoder 151 provides the selected DRAM or DRAM chip with the address data after being converted.

Incidentally, if chip selection needs to be done on a DRAM chip in the DRAM basis, the address decoder 151 provides the DRAM chip to be accessed with a chip selection signal. If chip selection is to be done for the option DRAM 162 on a DRAM chip basis, e.g., the address decoder 151 provides a memory area (DRAM chip) to be accessed with a chip selection signal.

The address decoder 151 of the embodiment identifies a destination of the output of the chip selection signal by means of the chip select converter 152.

The chip select converter 152 decides the destination of the output of the chip selection signal on the basis of the physical address data of the target to be accessed. Thus, the chip select converter 152 has information on allotment of memory areas, e.g., in each of the DRAMs (the standard and option DRAMs 161 and 162) that the controller 110 is equipped with. The information on allotment indicates, e.g., areas allotted correspondingly to sizes of the respective DRAMs starting from a base address which is a reference address of a particular DRAM area in specific order.

The chip select converter 152 examines a DRAM configuration in the controller 110, e.g., when the electronic apparatus 100 runs a process to start working. Then, the chip select converter 152 varies order of the allotment of the respective DRAM areas correspondingly to a detected DRAM configuration.

Figure 4:
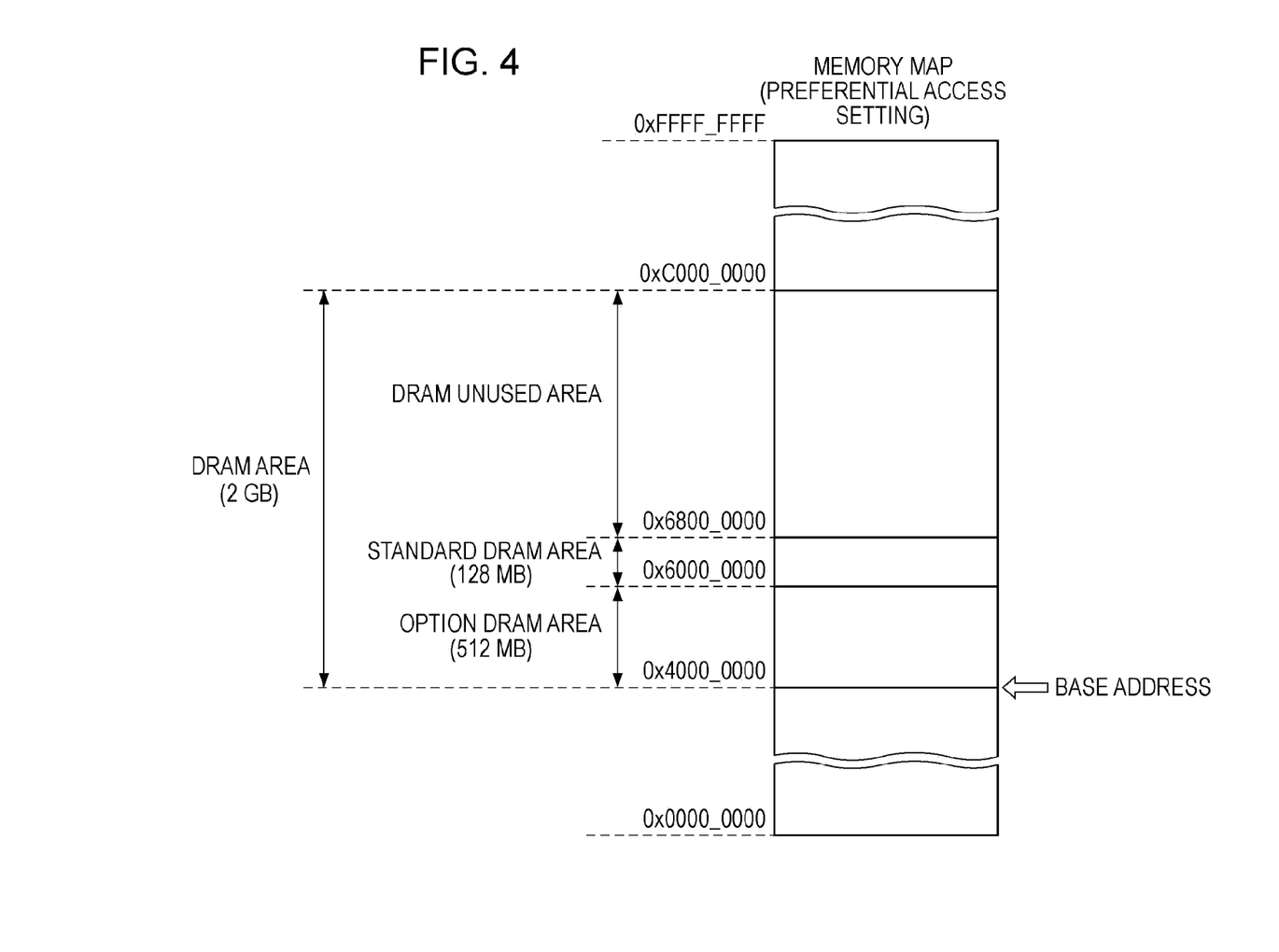
FIG. 4 is an exemplary memory map in case of a preferential access setting.
Figure 5:
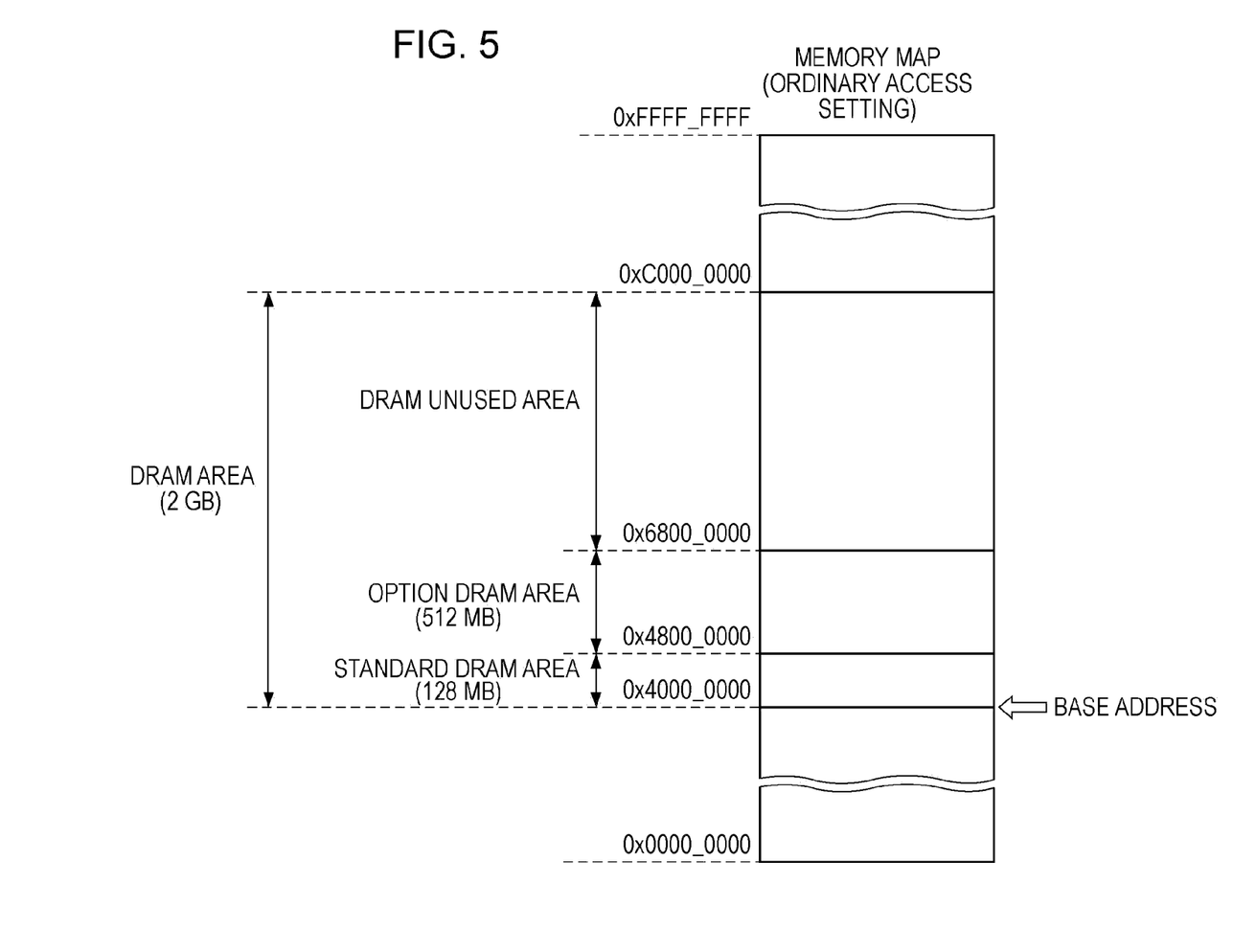
FIG. 5 is an exemplary memory map in case of an ordinary access setting.

If the bus width of the option DRAM 162 is broader than the bus width of the standard DRAM 161 according to the embodiment, the areas in the option DRAM 162 and in the standard DRAM 161 are allotted in order starting from the base address side, as described later in detail with reference to FIGS. 3-5 (an allotment setting in that order is called a "preferential access setting" as well, hereafter).

Meanwhile, if the bus width of the option DRAM 162 is equal to or narrower than the bus width of the standard DRAM 161, the sizes of the respective DRAMs are compared on a chip selection basis with one another. Then, if the size of the option DRAM 162 on the chip selection basis (both or each of the first and second memory areas) is larger than the size of the standard DRAM 161 on the chip selection basis (first memory area), the areas in the option DRAM 162 and in the standard DRAM 161 are allotted in order starting from the base address side (preferential access setting).

Meanwhile, if the size of the option DRAM 162 on the chip selection basis is equal to or smaller than the size of the standard DRAM 161 on the chip selection basis, the areas in the standard DRAM 161 and in the option DRAM 162 are allotted in order starting from the base address side (an allotment setting in that order is called an "ordinary access setting" as well, hereafter).

The chip select converter 152 decides a destination of the output of the chip selection signal which corresponds to the physical address data of the target to be accessed given by the address decoder 151 with reference to the information on allotment described above. Incidentally, if chip selection is done on a DRAM chip basis, the chip select converter 152 decides a destination of the output of the chip selection signal on that basis.

The command controller 153 carries out command control. The command controller 153 issues a command for carrying out a data operation (to write, read, etc.) on a memory area in the DRAM 160 that the address data after being converted by the address decoder 151 indicates, e.g., according to the access request.

The data controller 154 controls data. If, e.g., the access request is a request for writing, the data controller 154 transfers write data, i.e., a target of a write command to the DRAM 160 and writes the write data into the DRAM 160. Further, if the access request is a request for reading, the data controller 154 reads read data, i.e., a target of a read command from the DRAM 160 and receives the read data.

The interface 155 controls input and output between the memory controller 150 and the DRAM 160. The interface 155 controls transmission of, e.g., a chip selection signal, an address, a command, etc., to the DRAM 160 via a signal line. Further, the interface 155 controls data transmission and receiving (writing, reading, etc.) to and from the DRAM 160 via the external bus (data bus groups A and B).

The configuration of the electronic apparatus 100 described above is explained as to main portions in order that a feature of the embodiment is explained, and the electronic apparatus 100 is not limited by the above configuration. Further, a configuration that an electronic apparatus has in general will not be excluded. Further, the electronic apparatus 100 is divided into the portions described above according to what is mainly processed in order that the configuration can be easily understood. The invention is not limited depending upon how to divide the electronic apparatus into portions or how to name the portions. The electronic apparatus 100 can be divided into further more portions according to what is processed. Further, one portion can be subdivided so as to perform further more steps of data processing.

Then, an operation characteristic of the memory controller 150 described above will be explained.

Figure 3:
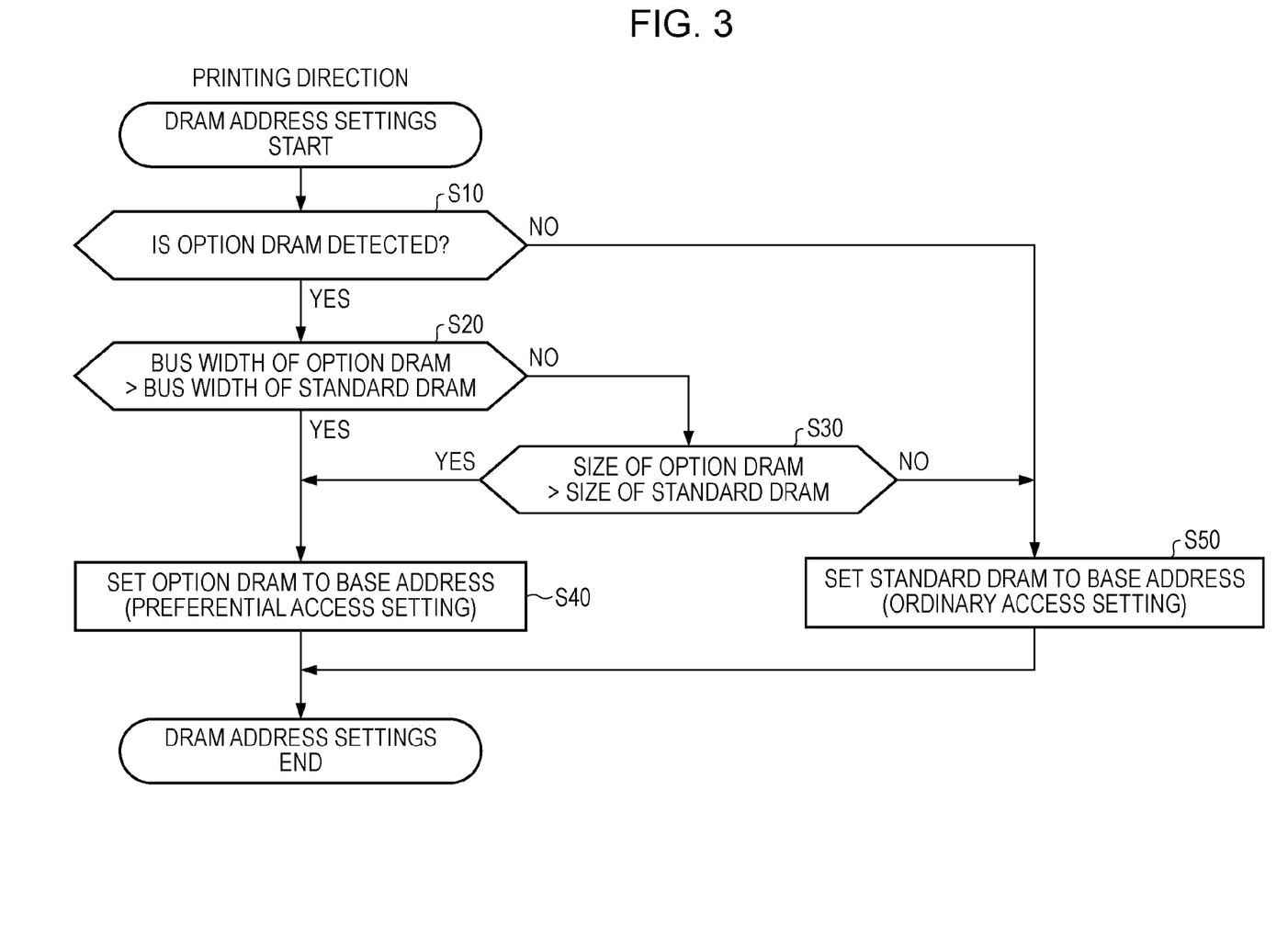
FIG. 3 is a flowchart which shows an example of data processing for DRAM address settings to be run by a memory controller.

FIG. 3 is a flowchart which shows an example of data processing for DRAM address settings to be run by the memory controller. The flow is run, e.g., while the electronic apparatus 100 having been powered on is running data processing to start working. The flow may be run at another timing as a matter of course, and may be run, e.g., in response to instructions by a user.

If the data processing for DRAM address settings starts, the chip select converter 152 decides whether an option DRAM is detected (S10). Specifically, the chip select converter 152 examines a DRAM configuration (whether the standard DRAM 161 is present, whether the option DRAM 162 is present, and performances (various kinds of configuration data such as bus widths, sizes, chis select bases, etc.) of the respective DRAMs) in the controller 110 and makes a decision. Incidentally, suppose that the standard DRAM 162 is certainly detected in the flow.

If the option DRAM 162 is detected (S10: YES), the chip select converter 152 decides whether the bus width of the option DRAM 162 is broader than the bus width of the standard DRAM 161 (S20). Incidentally, the bus widths of the option DRAM 162 and the standard DRAM 161 of the embodiment are 32 and 16 bits, respectively (see FIG. 2).

If the bus width of the option DRAM 162 is equal to or narrower than the bus width of the standard DRAM 161 (S20: NO), the chip select converter 152 decides whether a size of the option DRAM 162 is larger than a size of the standard DRAM 161 (S30). Specifically, the chip select converter 152 identifies a size on a chip selection basis of each of the DRAMs on the basis of the configuration data of each of the DRAMs obtained at S10, and compares the sizes with each other.

If the bus width of the option DRAM 162 is broader than the bus width of the standard DRAM 161 (S20: YES), or if the size of the option DRAM 162 on the chip selection basis is larger than the size of the standard DRAM 161 on the chip selection basis (S30: YES), the chip select converter 152 sets the option DRAM 162 to the base address (preferential access setting) (S40).

Specifically, the chip select converter 152 generates information on allotment of memory areas in the respective DRAMs. The chip select converter 152 manages physical addresses in a largest DRAM area (2 GB) which is controllable in the system, e.g., as shown in FIG. 4. Then, an area in the option DRAM 162 (from 0x4000_0000 to immediately before 0x6000_0000) and an area in the standard DRAM 161 (from 0x6000_0000 to immediately before 0x6800_0000) are allotted in order starting from a base address (0x4000_0000), i.e., a reference address in the relevant DRAM area (2 GB). Incidentally, an area excepting the DRAM 160 is managed as an unused area (from 0x6800_0000 to immediately before 0xC000_0000)

Unless the option DRAM 162 is detected (S10: NO), or if the size of the option DRAM 162 on the chip selection basis is equal to or smaller than the size of the standard DRAM 161 on the chip selection basis (S30: NO), the chip select converter 152 sets the standard DRAM 161 to the base address (ordinary access setting) (S50).

Specifically, if the size of the option DRAM 162 is equal to or smaller than the size of the standard DRAM 161 (S30: NO), the chip select converter 152 generates information on allotment of memory areas in the respective DRAMs. As shown in FIG. 5, e.g., the chip select converter 152 allots an area in the standard DRAM 161 (from 0x4000_0000 to immediately before 0x4800_0000) and an area in the option DRAM 162 (from 0x4800_0000 to immediately before 0x6800_0000) in order starting from a base address (0x4000_0000), i.e., a reference address in a largest DRAM area (2 GB). Incidentally, an area excepting the DRAM 160 is managed as an unused area (from 0x6800_0000 to immediately before 0xC000_0000).

Unless the option DRAM 162 is detected (S10: NO), the chip select converter 152 allots, e.g., an area in the standard DRAM 161 (from 0x4000_0000 to immediately before 0x4800_0000) from the base address (0x4000_0000). Incidentally, an area excepting the standard DRAM 161 is managed as an unused area (from 0x4800_0000 to immediately before 0xC000_0000).

Incidentally, the embodiment stands on condition that the performance (bus width and size) of the option DRAM of the electronic apparatus is as high as or higher than that of the standard DRAM. Thus, if the bus widths are equal (S20: NO), the process shifts to S30. It may be similarly practical, however, to suppose that the performance of the option DRAM of the electronic apparatus is lower than that of the standard DRAM. In the latter case, it may be practical, e.g., to shift the process to S30 if the bus widths are equal at S20, and to shift the process to S50 if the bus width of the option DRAM is narrower. The process may shift similarly as in FIG. 3 as a matter of course.

The chip select converter 152 ends the data processing for DRAM address settings after an end of S40 or S50.

The chip select converter 152 can identify a DRAM (DRA standard DRAM area 161 or option DRAM 162) that the physical address data (from 0x4000_0000 to immediately before 0x6800_0000) of the target to be accessed given by the address decoder 151 corresponds to with reference to the information on allotment generated as described above (S40, S50). If chip selection is done on a DRAM chip basis, the DRAM chip that the physical address data corresponds to can be identified. Then, the chip select converter 152 can decide a destination of an output of the chip selection signal.

The flow of data processing shown in FIG. 3 is divided into the respective data processing steps described above according to what is mainly processed so that the data processing by the memory controller 150 can be easily understood. The invention is not limited depending upon how the flow is divided into the data processing steps or what the data processing steps are called. The flow of data processing by the memory controller 150 can be divided into further more data processing steps according to what is processed. Further, one data processing step can be divided in such a way as to include further more processes.

An example of the first embodiment of the invention is explained above. According to the embodiment, an electronic apparatus on which plural memories having various performances such as bus widths are installed can more facilitate achievement of its potential as a system.

That is, the memory controller 150 of the embodiment compares the bus widths of the optional and standard memories with each other, and allots the optional and standard memory areas in order starting from the base address side on the memory map if the bus width of the optional memory is broader. As the optional memory having the broader bus width is more probably used a lot (use of the optional memory is rendered more preferential) according to the above configuration, the electronic apparatus can more facilitate achievement of its potential as a system.

A CPU, e.g., ordinarily unfolds a program on a DRAM and runs the program. Further, sizable data such as image data is sometimes unfolded on a DRAM being a work memory. Thus, if a DRAM including an area which is more frequently used grows in the bus width, efficiency of access to the DRAM is enhanced. Then, system performance can be enhanced and sizable data can be handled faster. A period of time after a user instructs, e.g., a printer to start printing and until the printer practically starts printing can be shortened, or so can be printing time. Further, scan time or copy time can be shortened for other apparatus.

Further, if the bus width of the optional memory is equal to or narrower than that of the standard memory, the memory controller of the embodiment compares the sizes on the chip selection bases of the optional and standard memories with each other, and allots an area in the memory of the larger size on the chip selection basis to the base address side according to a result of the comparison. According to such a configuration, degradation of system performance can be prevented owing to as much reduction as possible of a frequency of chip selection changeovers.

Specifically, e.g., suppose that a first memory of a smaller size on the chip selection basis is allotted to the base address side, and that a second memory of a larger size on the chip selection basis is allotted next. If that is the case, the first memory may more probably run short of the size on the chip selection basis with respect to the memory size to be used. If that is the case, the chip selection is more frequently changed over between chips in the first memory or between the first and second memories. As a result, overhead occurs in time of memory access. Incidentally, it is generally known that continuous access to one chip selection is more efficient than access to plural chip selections being changed over.

Second Embodiment

Then, a second embodiment of the invention will be explained while being centered on differences from the first embodiment.

The memory controller 150 of the first embodiment changes the order of allotments of the areas of the respective DRAMs according to the DRAM configuration. Meanwhile, the memory controller 150 of the embodiment performs control, while fixing the order of allotments of the areas of the respective DRAMs to the ordinary access setting, in such a way that the CPU preferentially uses a memory of a broader bus width.

The memory controller 150 examines a DRAM configuration in the controller 110, e.g., when the electronic apparatus 100 runs a process to start working. Upon detecting the option DRAM 162, the memory controller 150 permanently allots areas of the standard DRAM 161 and the option DRAM 162 in order starting from the base address side (ordinary access setting).

Meanwhile, the CPU 140 examines a DRAM configuration in the controller 110, e.g., when the electronic apparatus 100 runs a process to start working. Incidentally, a device excepting the CPU 140, e.g., the memory controller 150 may examine the DRAM configuration. Then, the CPU 140 generates information on allotment to be used by the CPU 140 in time of access to the DRAM 160 according to the detected DRAM configuration (logically rearranges the order of the respective DRAM areas without changing the information on allotment by the memory controller 150).

Figure 6:
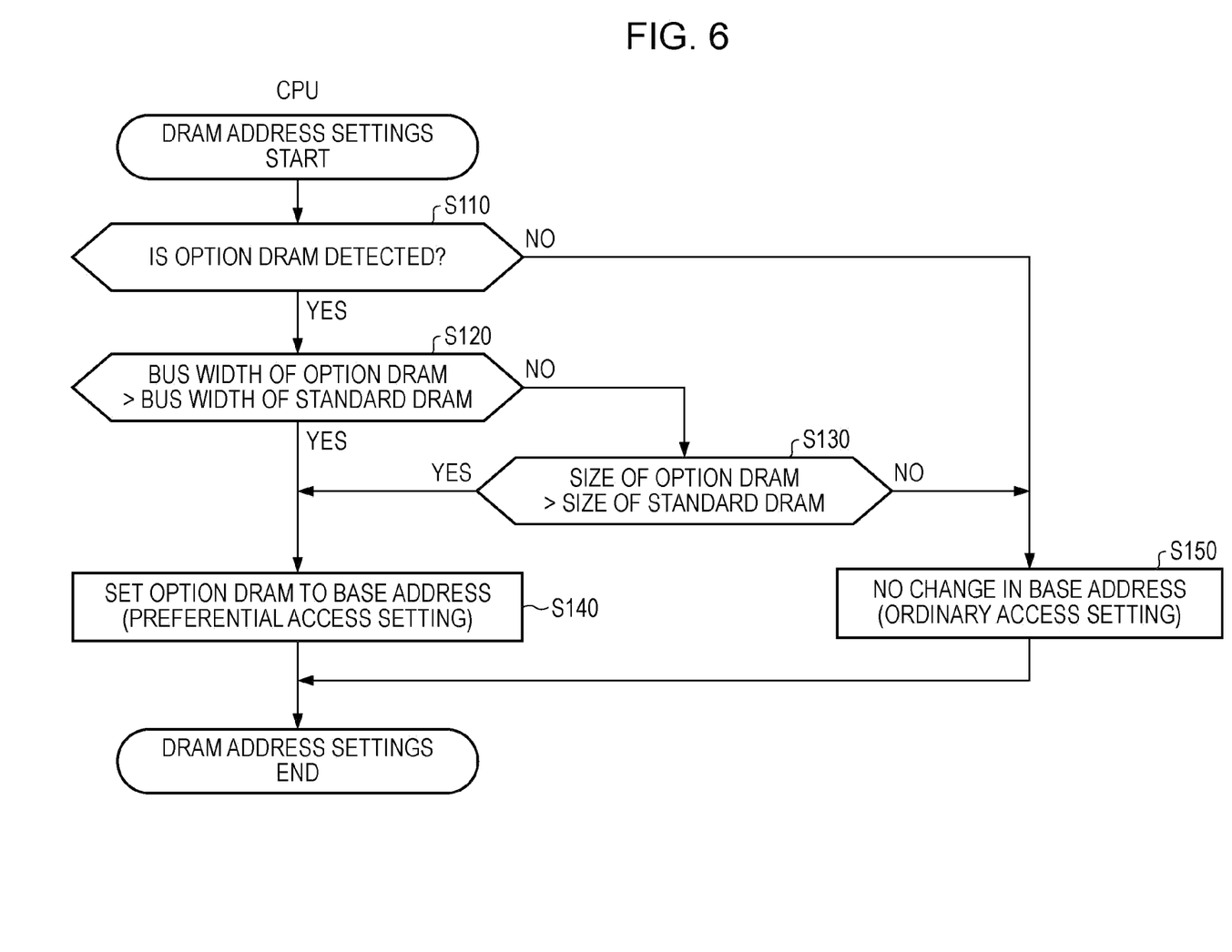
FIG. 6 is a flowchart which shows an example of data processing for DRAM address settings to be run by a CPU.

FIG. 6 is a flowchart which shows an example of data processing for DRAM address settings to be run by the CPU. The flow is run by the CPU, e.g., while the electronic apparatus 100 having been powered on is running a process to start working and after the memory controller 150 finishes setting information on allotment (ordinary access setting). The flow may be run at another timing as a matter of course, and may be run, e.g., in response to instructions by a user.

Steps S110-S130 are same as the steps S10-S30 in FIG. 3, and their explanations are omitted. The steps are run primarily by the CPU 140, though.

If the bus width of the option DRAM 162 is broader than the bus width of the standard DRAM 161 (S120: YES), or if the size of the option DRAM 162 on the chip selection basis is larger than the size of the standard DRAM 161 on the chip selection basis (S130: YES), the CPU 140 changes the base address to the option DRAM 162 (preferential access setting) (S140).

Figure 7:
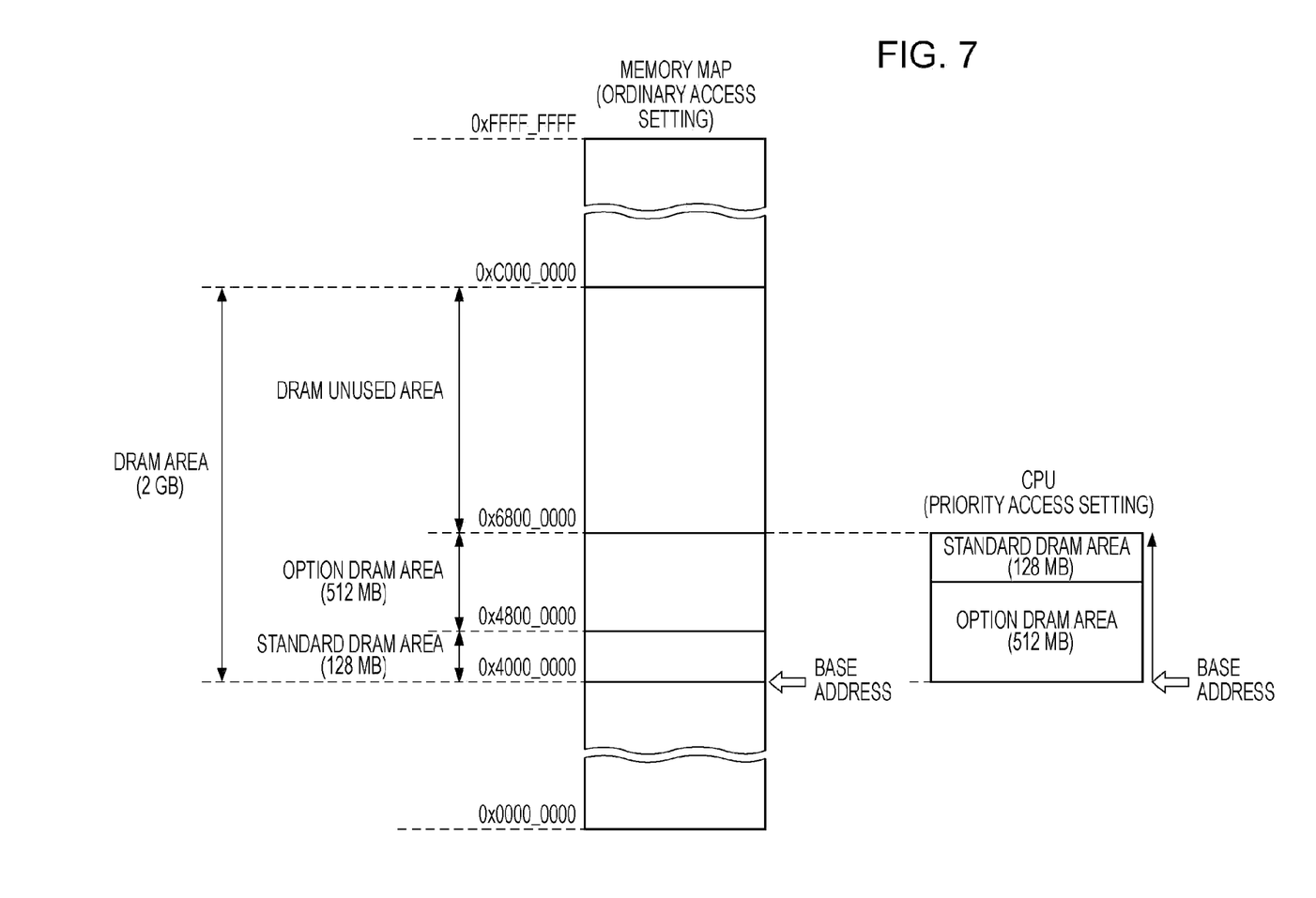
FIG. 7 is an exemplary memory map of the CPU in case of a preferential access setting.

Specifically, the CPU 140 generates information on logical allotment of memory areas in the respective DRAMs. As shown in FIG. 7, e.g., the CPU 140 sets the base address to the head of the area in the option DRAM 162 (0x4800_0000 (address corresponding to the sum of the former base address and the size of the standard DRAM 161)). Further, the CPU 140 makes a setting such that an area in the option DRAM 162 (from 0x4800_0000 to immediately before 0x6800_0000) is succeeded by an area in the standard DRAM 161 (from 0x4000_0000 to immediately before 0x4800_0000). That is, the CPU 140 generates information on allotment which logically rearranges for the area in the option DRAM 162 and the area in the standard DRAM 161 to be successive areas in this order.

Unless the option DRAM 162 is detected (S110: NO), or if the size of the option DRAM 162 on the chip selection basis is equal to or smaller than the size of the standard DRAM 161 on the chip selection basis (S130: NO), the CPU does not change the base address (ordinary access setting) (S150).

The CPU 140 ends the data processing for DRAM address settings after the end of the step S140 or S150.

The CPU 140 can use the memory areas in the DRAMs in order starting from the base address side (area in the option DRAM 162) logically set by the CPU by using the information on allotment generated as described above (S140). The CPU 140 uses the memory areas in order starting from the base address side, e.g., so as to store various kinds of programs and data. If used memory size is over the area in the option DRAM 162, the CPU 140 successively uses the area in the standard DRAM 161. Incidentally, upon receiving an access request, the address decoder 151 works similarly as explained as to the first embodiment.

Incidentally, an internal IP excepting the CPU 140 may generate and use information on allotment similarly as the CPU 140.

The flow of data processing shown in FIG. 6 is divided into the respective data processing steps described above according to what is mainly processed so that the data processing by the CPU 140 can be easily understood. The invention is not limited depending upon how the flow is divided into the data processing steps or what the data processing steps are called. The flow of data processing by the CPU 140 can be divided into further more data processing steps according to what is processed. Further, one data processing step can be divided in such a way as to include further more processes.

An example of the second embodiment of the invention is explained above. The electronic apparatus of the embodiment can achieve an effect similar to that of the first embodiment by means of software processes by the CPU instead of hardware processes by the memory controller. Hardware design of the memory controller, etc., is never or barely changed owing to the achievement by the CPU.

Incidentally, it is intended that the embodiments of the invention described above exemplarily show scope and coverage of the invention without limiting the invention. Lots of alternatives, corrections and modifications are obvious to a person ordinarily skilled in the art of the invention.

The embodiments described above can be applied, e.g., to a case where there are three or more DRAMs, e.g., one standard DRAM and plural option DRAMs. It is sufficient in this case as well to compare the bus widths of the respective DRAMs with one another and to allot areas in the respective DRAMs in descending order of the bus width starting from the base address. It is sufficient to compare sizes of DRAMs of equal bus widths on chip selection bases with one another, and to allot areas in the respective DRAMs in descending order of the sizes on the chip selection bases starting from the side closer to the base address.

Incidentally, the invention can be applied to an electronic apparatus, a memory system, etc., having not only DRAMs but memories of different performances such as bus widths.

The entire disclosure of Japanese Patent Application No. 2012-028410, filed Feb. 13, 2012 is expressly incorporated by reference herein.

What is claimed is:

1. An electronic apparatus comprising:
a first memory that is set to abuse address of a memory area; and
a memory controller configured to control the first memory,
wherein when the electronic apparatus runs a process to start working, the memory controller examines a memory configuration of the first memory and a second memory,
upon the second memory being detected as a result of the examination, the memory controller
compares bus widths of the first memory and the second memory, and
when the bus width of the second memory is broader than the bus width of the first memory, sets the second memory to the base address in place of the first memory such that access to the second memory precedes access to the first memory.

2. The electronic apparatus according to claim 1, wherein the memory controller compares sizes of the first memory and the second memory when the bus width of the second memory is equal to or narrower than the bus width of the first memory, and
makes a setting such that access to the second memory precedes access to the first memory when the size of the second memory is larger than the size of the first memory.

3. The electronic apparatus according to claim 2, wherein the memory controller
compares a size per one memory area selected by a selection signal in the first memory with a size per one memory area selected by a selection signal in the second memory, and
makes a setting such that access to the second memory precedes access to the first memory when the size per memory area in the second memory is larger than the size per memory area in the first memory.

4. The electronic apparatus according to claim 1, wherein, upon a plurality of memories each corresponding to the second memory being detected, the memory controller
compares bus widths of the respective memories with one another, and
makes a setting such that access to one of the memories of a broader bus width precedes access to another one of the memories.

5. The electronic apparatus according to claim 4, wherein, when bus widths of two of the first memory and the second memories are equal to each other, the memory controller compares sizes of the memories of the equal bus widths, and makes a setting such that access to one of the compared memories of a larger size precedes access to another one of the compared memories.

6. The electronic apparatus according to claim 1, wherein the memory controller
outputs a selection signal to select the second memory when an address indicating a location in the memory areas specified by an access request indicates an inside of the second memory in the memory areas, and
outputs a selection signal to select the first memory when the address indicates an inside of the first memory in the memory areas.

7. An electronic apparatus comprising:
a first memory set to a base address of a memory area;
a memory controller configured to control the first memory, wherein when the electronic apparatus runs a process to start working, the memory controller examines a memory configuration of the first memory and a second memory;
and upon the second memory being detected as a result of the examination, compare bus widths of the first memory and the second memory, and
when the bus width of the second memory is broader than the bus width of the first memory, moves the second memory to the base address in place of the first memory such that access to the second memory precedes access to the first memory.

8. The electronic apparatus according to claim 7, wherein when the bus width of the second memory is broader than the bus width of the first memory, the CPU sets an address corresponding to a sum of the base address and a size of the first memory as a base address for access that the CPU uses so as to access the memory area, and makes a setting such that the area of the first memory follows an address corresponding to a sum of the base address for access and a size of the second memory.

9. A method for memory control of an electronic apparatus having a first memory set to a base address of a memory area, and a memory controller configured to control the first memory, the method comprising:
   examining a memory configuration of the first memory and a second memory when the electronic apparatus rims a process to start working:
   comparing, upon the second memory being detected as a result of the examination, bus widths of the first memory and the second memory with each other using a memory controller; and when the bus width of the second memory is broader than the bus width of the first memory, setting the second memory to the base address in place of the first memory such that access to the second memory precedes access to the first memory.

10. The electronic apparatus according to claim 1, wherein the first memory is not capable of being removed from the electronic apparatus, and
    the second memory is capable of being removed from and put onto the electronic apparatus.

11. The electronic apparatus according to claim 10, wherein the memory controller makes the setting when the second memory is put onto the electronic apparatus.

* * * * *